United States Patent
Araki

(10) Patent No.: US 8,901,999 B2
(45) Date of Patent: Dec. 2, 2014

(54) AUDIO-OUTPUT AMPLIFIER CIRCUIT FOR AUDIO DEVICE, AUDIO DEVICE, ELECTRONIC DEVICE INCLUDING AUDIO DEVICE, AND OUTPUT CONTROL METHOD FOR AUDIO DEVICE

(71) Applicant: Ryuichi Araki, Kyoto (JP)

(72) Inventor: Ryuichi Araki, Kyoto (JP)

(73) Assignee: Ricoh Company, Ltd., Tokyo (JP)

(*) Notice: Subject to any disclaimer, the term of this patent is extended or adjusted under 35 U.S.C. 154(b) by 57 days.

(21) Appl. No.: 13/652,542

(22) Filed: Oct. 16, 2012

(65) Prior Publication Data
US 2013/0106510 A1   May 2, 2013

(30) Foreign Application Priority Data
Oct. 27, 2011   (JP) .................... 2011-235994

(51) Int. Cl.
    *H03F 1/14*   (2006.01)
(52) U.S. Cl.
    USPC .......................................... 330/51

(58) Field of Classification Search
    USPC .................... 330/51; 381/94.5, 120, 121
    See application file for complete search history.

(56) References Cited

U.S. PATENT DOCUMENTS

| | | | |
|---|---|---|---|
| 6,316,993 B1 * | 11/2001 | Hellums | 330/51 |
| 7,092,534 B2 * | 8/2006 | Wang et al. | 381/94.5 |
| 7,254,244 B2 * | 8/2007 | Henson et al. | 381/120 |
| 7,880,540 B2 * | 2/2011 | Hou et al. | 330/51 |
| 8,149,049 B2 * | 4/2012 | Takeuchi | 330/51 |
| 8,482,347 B2 * | 7/2013 | Mehr et al. | 330/51 |
| 2005/0084120 A1 | 4/2005 | Hagino | |
| 2012/0105153 A1 | 5/2012 | Doi | |

FOREIGN PATENT DOCUMENTS

| | | |
|---|---|---|
| JP | 2005-109654 | 4/2005 |
| JP | 2010-21775 | 1/2010 |
| JP | 2011-29683 | 2/2011 |

* cited by examiner

*Primary Examiner* — Khanh V Nguyen
(74) *Attorney, Agent, or Firm* — Cooper & Dunham LLP

(57) ABSTRACT

An audio-output amplifier circuit for an audio device includes an output amplifier and a switching element connected between an amplifier-output terminal of the output amplifier and ground, to short-circuit the amplifier-output terminal of the output amplifier after transition to ground-level voltage is finished.

9 Claims, 2 Drawing Sheets

AUDIO-OUTPUT AMPLIFIER CIRCUIT FOR AUDIO DEVICE, AUDIO DEVICE, ELECTRONIC DEVICE INCLUDING AUDIO DEVICE, AND OUTPUT CONTROL METHOD FOR AUDIO DEVICE

CROSS-REFERENCE TO RELATED APPLICATION

This patent application is based on and claims priority pursuant to 35 U.S.C. §119 to Japanese Patent Application No. 2011-235994, filed on Oct. 27, 2011 in the Japan Patent Office, the entire disclosure of which is hereby incorporated by reference herein.

BACKGROUND

1. Technical Field

The present disclosure relates to an audio-output amplifier circuit for an audio device, an audio device, an electronic device including the audio device, and an output control method to switch the audio device, and more particularly to an audio-output amplifier circuit to reduce pop more stably.

2. Description of the Related Art

It is well known that audio devices sometimes generate an unusual crackling sound (pop) when a power supply of an audio output amplifier of the audio device is turned on or off. As a technology for reducing pop, JP-2011-029683-A discloses a pop reduction circuit to control an audio-output amplifier circuit so that an output voltage of an output amplifier of the audio-output amplifier circuit transits smoothly, using raised cosine and ramp waveforms, when the output amplifier is switched on and off.

FIG. 1 is a circuit diagram illustrating a configuration of an audio-output amplifier circuit 7X including an output amplifier 1. FIG. 2 is a timing chart illustrating operation of the audio-output amplifier circuit 7X shown FIG. 1, assuming that a time-constant determined by a resistance of an output resistance load and a capacitance of a DC-cut capacitor is large.

In this example shown in FIG. 1, a capacitor 3 (DC-cut capacitor) is attached to an audio device 8X including a pop reduction circuit 6, and the DC-cut capacitor 3 blocks a direct-current (DC) component of the output signal when the audio output amplifier 1 of the audio device 8X is turned off. With this configuration, when a time-constant determined by a resistance RL of an external resistance load 4 and a capacitance C1 of the DC-cut capacitor 3 is large relative to a transition time of an output voltage $V_{OUT}$, a residual charge is remaining in the DC-cut capacitor 3 even after the transition of the output voltage $V_{OUT}$ is finished.

Therefore, if the output voltage $V_{OUT}$ of the audio device 8X is turned off in this condition, a pathway to discharge the residual charge is shut off, and a level difference may occur in the waveform (11, 12 shown in FIG. 2) after the capacitor 3 blocks the DC because an output voltage $V_{OUTRL}$ after the DC cut suddenly rises, which may generate the pop.

A specific example is described below with reference to FIGS. 1 and 2. In FIG. 1, the output amplifier 1 is switched on and off based on an audio output control signal PD, and an output terminal (amplifier-output terminal) 1a of the output amplifier 1 is connected to an output terminal 2 of the audio device 8X. The output terminal 2 is connected to ground via the DC-cut capacitor 3 and the resistance load 4 A pop reduction circuit 6 that generates a reference voltage $V_{REF}$ input to the output amplifier 1 is provided in a previous stage of the output amplifier 1.

In the audio-output amplifier circuit 7X of this example, immediately before the output amplifier 1 is switched off, the pop reduction circuit 6 varies the reference voltage $V_{REF}$ so that the output voltage $V_{OUT}$ transits from a setting reference voltage value $V_{SET}$ to a ground-level voltage 0. Then, the output amplifier 1 is switched off after the output voltage $V_{OUT}$ at the outer terminal 2 reaches the ground-level voltage 0. When the output amplifier 1 is switched off, the amplifier-output terminal 1a enters a high-impedance state.

In FIG. 2, a primary delay element, based on the time-constant determined by the resistance RL of the external resistance load (output load) 4 and the capacitance C1 of the DC-cut capacitor 3, dominantly acts on the output voltage $V_{OUTRL}$ of the output load 4 after the DC-cut capacitor 3 blocks the DC component, and accordingly, transition of the waveform of the output voltage $V_{OUTRL}$ across the external load 4 is delayed compared with the waveform of the output voltage $V_{OUT}$ at the output terminal 2.

Then, even after the transition of the output voltage $V_{OUT}$ is finished and the output voltage $V_{OUT}$ reaches the ground-level voltage, the output voltage $V_{OUTRL}$, after the DC-cut capacitor 3 blocks the DC, does not reach the ground-level voltage because of the charge remains in the capacitance C1 of the DC-cut capacitor 3.

In this state, if the output amplifier 1 is switched off and the amplifier-output terminal 1a of the output amplifier 1 rises to a high impedance, a pathway to discharge the charge remaining in the capacitance C1 of the DC-cut capacitor 3 is shut off, which generates a large difference (step) in level of the waveform of the output voltage (11, 12 shown in FIG. 2). Therefore, the pop may be generated.

BRIEF SUMMARY

In one aspect of this disclosure, there is provided a novel audio-output amplifier circuit for an audio device, including an output amplifier and a switching element connected between an amplifier-output terminal of the output amplifier and ground, to short-circuit the amplifier-output terminal of the output amplifier after transition to ground-level voltage is finished.

In another aspect of this disclosure, there is provided a novel audio device connected to a load via a DC-cut capacitor. The audio device includes an output terminal, an output amplifier, a pop reduction circuit, and a switching element. The output terminal outputs an output voltage, connected to the DC-cut capacitor that is connected in series to the load. An audio control signal and a variable reference voltage are input to the output amplifier, and the output amplifier has an amplifier-output terminal connected to the output terminal of the audio device. The pop reduction circuit, provided in a previous stage of the output amplifier, generates and varies the reference voltage. The switching element is connected between the amplifier-output terminal and ground.

In yet another aspect of this disclosure, there is provided an output control for switching off of the above-described audio device. The control method includes the steps of: decreasing the reference voltage using the pop reduction circuit immediately before the output amplifier is switched off; transiting the output voltage at the output terminal to a ground-level voltage; switching the output amplifier off once the transition of the output voltage is finished; turning the switching element on in conjunction with the output amplifier being switched off; and shorting the amplifier-output terminal to ground.

BRIEF DESCRIPTION OF THE DRAWINGS

The aforementioned and other aspects, features and advantages are better understood by reference to the following detailed description when considered in connection with the accompanying drawings, wherein.

DETAILED DESCRIPTION OF PREFERRED EMBODIMENTS

Figure 1:
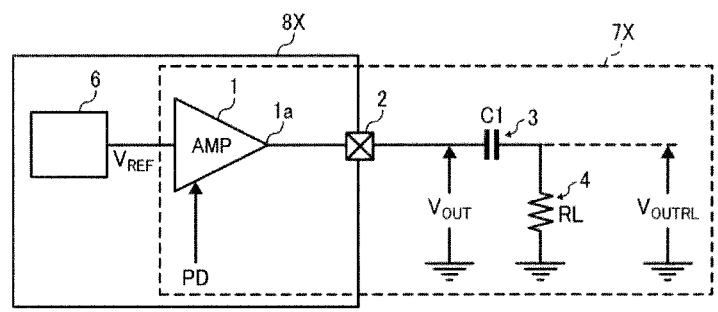
FIG. 1 is a circuit diagram illustrating a configuration of a related art audio-output amplifier circuit.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 3:
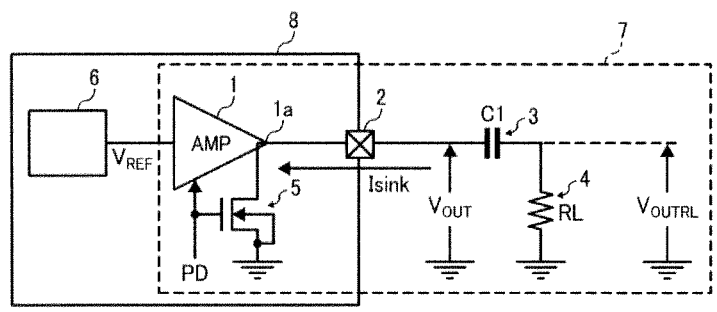
FIG. 3 is a circuit diagram illustrating a configuration of an audio-output amplifier circuit according to the present disclosure.
Figure 4:
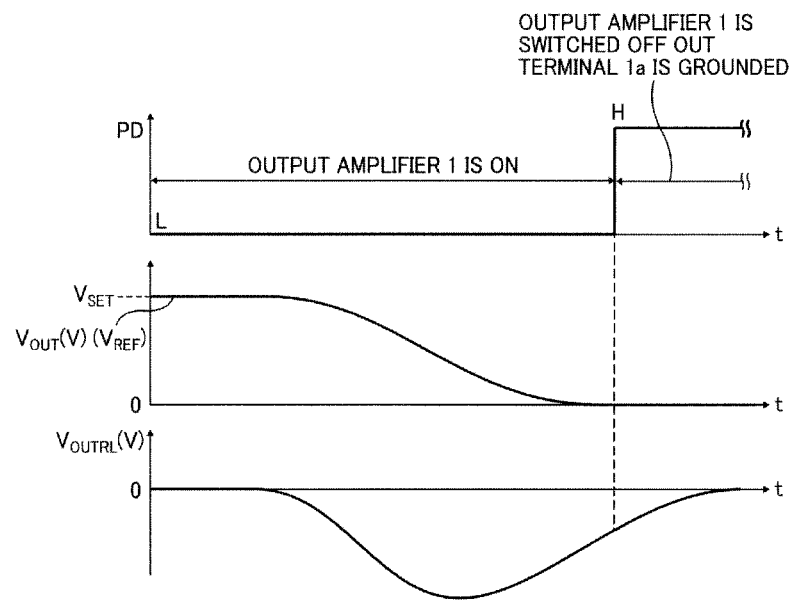
FIG. 4 is a timing chart illustrating operation of the audio-output amplifier circuit shown in FIG. 3.

Referring now to the drawings, wherein like reference numerals designate identical or corresponding parts throughout the several views, and particularly to FIGS. 3 and 4, an audio-output amplifier circuit for an audio device according to an illustrative embodiment is described.

FIG. 3 is a circuit diagram illustrating a configuration of an audio-output amplifier circuit for an audio device. FIG. 4 is a timing chart illustrating the operation of the audio-output amplifier circuit.

In FIG. 3, an audio-output amplifier circuit 7 for an audio device 8 includes an output amplifier 1 and a switching element 5 connected between an amplifier-output terminal 1a of the output amplifier 1 and a ground, to short-circuit the output terminal 1a of the output amplifier 1 after transition to ground-level voltage of an output voltage $V_{OUT}$ is finished, which is described in further detail later.

The output amplifier 1 is switched on and off based on an audio output control signal PD. A pop reduction circuit 6 is provided in a previous stage of the output amplifier 1. The amplifier-output terminal 1a of the output amplifier 1 is connected to an output terminal 2 of the audio device 8. The output terminal 2 of the audio device 8 is connected to the ground via an external direct-current component cut capacitor (DC-cut capacitor) 3 and an external resistance load 4. The resistance load 4 may be a speaker, for example. The output amplifier 1, the switching element 5, the DC-cut capacitor 3, and the load 4 constitute an audio-output amplifier circuit 7 working for the audio device 8.

In FIGS. 3 and 4, the output voltage $V_{OUT}$ is a voltage at the output terminal 2. An output voltage $V_{OUTRL}$ is an inductive voltage across the resistance load 4 and is a voltage after the DC-cut capacitor 3 cuts a direct-current component of the output voltage $V_{OUT}$.

Figure 2:
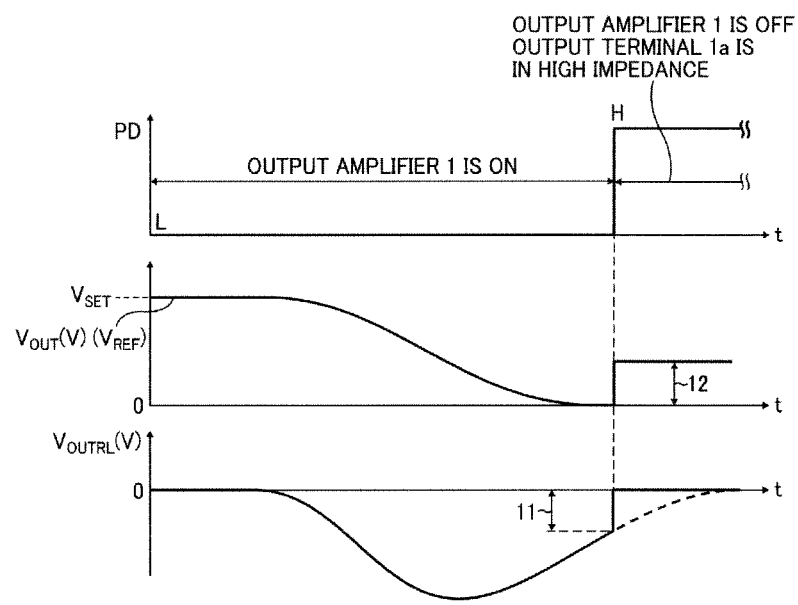
FIG. 2 is a timing chart illustrating operation of the related-art audio-output amplifier circuit shown in FIG. 1.

In a comparative example of an audio-output amplifier circuit 7X (see FIGS. 1 and 2), immediately before the output amplifier 1 is switched off, the pop reduction circuit 6 varies a reference voltage $V_{REF}$ so that the output voltage $V_{OUT}$ transits from a setting reference voltage value $V_{SET}$ to a ground-level voltage 0. Then, the output amplifier 1 is switched off after the output voltage $V_{OUT}$ reaches the ground-level voltage 0. When the output amplifier 1 is switched off, the amplifier-output terminal 1a enters a high-impedance state. With this configuration, even after the transition of the output voltage $V_{OUT}$ is finished and the output voltage $V_{OUT}$ reaches the ground-level voltage 0, the output voltage $V_{OUTRL}$ after the DC-cut capacitor 3 blocks direct-current (DC) component does not reach the ground-level voltage 0 because of the charge remaining in a capacitance C1 of the DC-cut capacitor 3. Therefore, if the output voltage $V_{OUT}$ of the audio device 8 is switched off in this situation, a pathway to discharge the residual charge is shut off, and therefore, the output voltage $V_{OUTRL}$ is sharply rises (a level difference may occur in the waveform shown in 11, 12 of FIG. 2) after the capacitor 3 blocks the DC component, which may generate the pop.

By contrast, in the audio-output amplifier circuit 7 according to the present disclosure shown in FIGS. 3 and 4, when the output amplifier 1 is switched off, the switching element 5 is switched on. Then, the output voltage $V_{OUT}$ at the amplifier-output terminal 1a of the output amplifier 1 gradually increases to the ground-level voltage 0 (comes to short circuit) via on-state of the switching element 5 after the output amplifier 1 is off.

In the audio-output amplifier circuit 7 of FIG. 3, the output voltage $V_{OUTRL}$ also smoothly transits to the ground-level voltage 0, similarly to the output voltage $V_{OUT}$ that is controlled by the pop reduction circuit 6. More specifically, even if the output voltage $V_{OUT}$ of the audio device 8 is switched off when the output voltage $V_{OUTRL}$ across the load 4 does not reach the ground-level voltage 0, a pathway to discharge a residual charge remaining in the capacitance C1 of the DC-cut capacitor 3 remains ensured by the on-state of the switching element 5 connected to the ground. Therefore, the residual charge remaining in the capacitance C1 of the DC-cut capacitor 3 is all discharged via the on-state of the switching element 5 after the output voltage $V_{OUT}$ reaches the ground-level voltage, and then, the output voltage $V_{OUTRL}$ across the load 4 smoothly increases to the ground-level voltage, without generating the steps (level difference 11, 12 shown in FIG. 2) in the waveform of the output voltage $V_{OUTRL}$ (without changing the output voltages $V_{OUT}$ and $V_{OUTRL}$ suddenly). Accordingly, the generation of pop can be prevented.

With this operation, even in a case in which a time-constant determined by the load 4 and the DC cut capacitance 3 is long (large), when the output amplifier 1 of the audio device 8 is switched off, the generation of pop can be solved.

Herein, the output amplifier 1 may include a negative channel driver transistor 5. In this configuration, the switching element 5 is constituted by a negative-channel driver transistor of the output amplifier 1. Similarly to the switching element 5, the N-channel driver transistor can short-circuit the amplifier-output terminal 1a of the output amplifier 1 after transition to ground-level voltage of the output voltage $V_{OUT}$ of the output amplifier 1 is finished.

In a configuration in which the N-channel driver transistor is used as the above-described switching element 5 to short-circuit the amplifier-output terminal 1a, the pop can be eliminated without the need to provide an additional circuit element.

It is to be noted that the audio-output amplifier circuit according to the present specification is not limited to the audio device shown in FIG. 3, and is widely adaptable to other types of electronic devices, such as mobile phones, personal computers, and television receivers.

As described above, in the present disclosure, even in a case in which the time-constant determined by the load 4 and the DC-cut capacitance 3 is long, when the output amplifier is turned off, the generation of the pop can be prevented. In addition, the N-channel driver transistor of the output amplifier can be substituted for the switching element for short-circuiting to ground, which can eliminate the pop without adding circuit elements.

Numerous additional modifications and variations are possible in light of the above teachings. It is therefore to be understood that, within the scope of the appended claims, the disclosure of this patent specification may be practiced otherwise than as specifically described herein.

What is claimed is:

1. An audio-output amplifier circuit for an audio device including a pop reduction circuit to generate a variable reference voltage, comprising:
    an output amplifier, the pop reduction circuit being provided in a previous stage of the output amplifier, to provide the variable reference voltage to an input of the output amplifier; and
    a switching element connected between an amplifier-output terminal of the output amplifier and ground, to short-circuit the amplifier-output terminal of the output amplifier after transition to ground-level voltage is finished,
    wherein an audio control signal is supplied to the output amplifier and to the switching element to turn off the output amplifier and concurrently turn on the switching element to short-circuit the amplifier-output terminal of the output amplifier, and
    wherein the variable reference voltage provided by the pop reduction circuit to the input of the output amplifier is decreased immediately before the output amplifier is turned off and the switching element is turned on.

2. The audio-output amplifier circuit according to claim 1, wherein the switching element comprises an N-channel driver transistor.

3. The audio-output amplifier circuit according to claim 1, further comprising a load and a DC-cut capacitor connected in series to the load.

4. An audio device connected to a load via a DC-cut capacitor, comprising:
    an output terminal to output an output voltage, connected to the DC-cut capacitor that is connected in series to the load;
    an output amplifier to which an audio control signal and a variable reference voltage are input, having an amplifier-output terminal connected to the output terminal of the audio device;
    a pop reduction circuit, provided in a previous stage of the output amplifier, to generate and vary the variable reference voltage; and
    a switching element connected between the amplifier-output terminal and ground,
    wherein the audio control signal is supplied to the output amplifier and to the switching element to turn off the output amplifier and concurrently turn on the switching element to short-circuit the amplifier-output terminal of the output amplifier, and
    wherein the variable reference voltage provided by the pop reduction circuit to the input of the output amplifier is decreased immediately before the output amplifier is turned off and the switching element is turned on.

5. The audio device according to claim 4, wherein, immediately before the output amplifier is switched off, the pop reduction circuit decreases the variable reference voltage to transit the output voltage at the output terminal to a ground-level voltage,
    wherein, after the transition of the output voltage is finished, the output amplifier is switched off and the switching element is turned on to short the amplifier-output terminal to ground.

6. The audio device according to claim 5, wherein, in a case in which transition of a voltage across the load is delayed from that of the output voltage at the output terminal, when the output amplifier is switched off, the voltage across the load is smoothly varied to the ground-level voltage.

7. The audio device according to claim 4, wherein the switching element comprises an N-channel driver transistor.

8. An electronic device comprising the load, the DC-cut capacitor, and the audio device of claim 4.

9. A output control method for switching off of an audio device connected to a load via a DC-cut capacitor and having an output terminal to output an output voltage, connected to the DC-cut capacitor that is connected in series to the load; an output amplifier to which an audio control signal and a variable reference voltage are input, having an amplifier-output terminal connected to the output terminal; a pop reduction circuit, provided in a previous stage of the output amplifier, to generate and vary the variable reference voltage; and a switching element connected between the amplifier-output terminal and ground,
    the control method comprising the steps of:
    (a) decreasing the variable reference voltage using the pop reduction circuit immediately before the output amplifier is switched off,
    (b) transiting the output voltage at the output terminal to a ground-level voltage;
    (c) switching the output amplifier off once the transition of the output voltage is finished;
    (d) turning the switching element on in conjunction with the output amplifier being switched off; and
    (e) shorting the amplifier-output terminal to ground,
    wherein the audio control signal is supplied to the output amplifier and to the switching element to turn off the output amplifier in (c) and concurrently turn on the switching element in (d) to short-circuit the amplifier-output terminal of the output amplifier in (e), and
    wherein the variable reference voltage provided by the pop reduction circuit to the input of the output amplifier is decreased in (a) immediately before the output amplifier is turned off in (c) and the switching element is turned on in (d).

* * * * *